United States Patent
Twede et al.

(10) Patent No.: US 9,110,292 B1
(45) Date of Patent: Aug. 18, 2015

(54) MULTIPLE FILTER PHOTON CONVERSION ASSEMBLY

(71) Applicant: Lockheed Martin Corporation, Bethesda, MD (US)

(72) Inventors: David R. Twede, Orlando, FL (US); Bryan C. Gundrum, Ocoee, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 41 days.

(21) Appl. No.: 14/107,231

(22) Filed: Dec. 16, 2013

Related U.S. Application Data

(63) Continuation-in-part of application No. 13/891,692, filed on May 10, 2013.

(60) Provisional application No. 61/645,514, filed on May 10, 2012.

(51) Int. Cl.
  *H04N 5/217* (2011.01)
  *H01S 3/30* (2006.01)
  *G02B 27/10* (2006.01)

(52) U.S. Cl.
  CPC .................................. *G02B 27/1006* (2013.01)

(58) Field of Classification Search
  CPC ........................ H04N 5/2254; H01L 27/14621
  USPC ............................................. 348/294, 231.99
  See application file for complete search history.

(56) References Cited

U.S. PATENT DOCUMENTS

| | | |
|---|---|---|
| 6,950,492 B2 | 9/2005 | Besson |
| 6,960,767 B1 | 11/2005 | Do et al. |
| 7,121,474 B2 | 10/2006 | Bourianoff et al. |
| 7,532,703 B2 | 5/2009 | Du et al. |
| 7,937,280 B1 | 5/2011 | Leung et al. |
| 2002/0117635 A1 | 8/2002 | Shinada et al. |
| 2009/0027518 A1 | 1/2009 | Kita |

(Continued)

FOREIGN PATENT DOCUMENTS

WO 2012174173 A2 12/2012

OTHER PUBLICATIONS

Ferrer, Domingo et al., "Atomic structure of three-layer Au/Pd nanoparticles revealed by aberration-corrected scanning transmission electron microscopy," Journal of Materials Chemistry, vol. 18, Mar. 19, 2008, RSCPublishing, 6 pages.

(Continued)

*Primary Examiner* — Joel Fosselman
(74) *Attorney, Agent, or Firm* — Withrow & Terranova, PLLC

(57) ABSTRACT

A photon conversion assembly. A first filter assembly is configured to transmit photons in at least one received band in a downstream direction of an optical pathway and to reflect photons in at least one converted band that are moving in an upstream direction of the optical pathway. A photon conversion material has a first side and a second side. The first side is downstream of the first filter assembly, and the second side is upstream of a second filter assembly. The photon conversion material is configured to convert photons in at least one received band to photons in at least one converted band. A second filter assembly is configured to transmit photons in the at least one converted band in a downstream direction of the optical pathway and to reflect photons in the at least one received band that are moving in the downstream direction of the optical pathway.

18 Claims, 11 Drawing Sheets

(56) References Cited

U.S. PATENT DOCUMENTS

2013/0215912 A1* 8/2013 Shkunov et al. .................. 372/3
2014/0194314 A1* 7/2014 Walsworth et al. ............... 506/9

OTHER PUBLICATIONS

Non-Final Office Action for U.S. Appl. No. 14/169,906 mailed Sep. 18, 2014, 16 pages.
Author Unknown, "Luminescent Up-conversion Nanocrystals," Biochemical Products, Sigma-Aldrich Co. LLC, 2013, http://www.sigmaaldrich.com/life-science/biochemicals/biochemical-products, accessed Apr. 23, 2013, 1 page.
Author Unknown, "Sunstone Upconverting Nanocrystals UCP 475," Material Safety Data Sheet, Version 5.1, Sigma-Aldrich Co. LLC, Revised May 31, 2012, 6 pages.
Author Unknown, "Sunstone Luminescent UCP Nanocrystals," Technical Document, Sigma-Aldrich Co. LLC, http://www.sigmaaldrich.com/technical-documents/articles/biology/upconverting-ucp-nanocrystals.html, accessed Apr. 23, 2013, 6 pages.
Shun, Poh Hou, "Towards a High Quality Polarization-Entangled Multi-Photon Source," A Thesis Submitted for the Degree of Master of Science, Department of Physics, National University of Singapore, 2009, 113 pages.
Gorris et al., "Photon-upconverting nanoparticles for optical encoding and multiplexing of cells, biomolecules, and microspheres," Angewandte Chemie International Edition, vol. 52, No. 13, Mar. 25, 2013, pp. 3584-3600 (abstract only).
McCutcheon et al., "Broadband frequency conversion and shaping of single photons emitted from a nonlinear cavity," Optics Express, vol. 17, No. 25, Dec. 7, 2009, 15 pages.
Suyver et al., "Novel materials doped with trivalent lanthanides and transition metal ions showing near-infrared to visible photon upconversion," Optical Materials, vol. 27, No. 6, Mar. 2005, pp. 1111-1130 (abstract only).
Tyson, Jeff et al., "How Airport Security Works," the Pallet, vol. 55, Feb. 2008, travel.howstuffworks.com/airport-security.htm, 5 pages.
Girard, C. et al., "The physics of the near-field," Reports on Progress in Physics, vol. 63, No. 6, Jun. 2000, IOP Publishing Ltd., 46 pages.
Jain, P., "Plasmons in Assembled Metal Nanostructures: Radiative and Nonradiative Properties, Near-Field Coupling and its Universal Scaling Behavior," Doctoral Dissertation, Georgia Institute of Technology, Apr. 2008, 316 pages.
Pucci, A. et al., "Chapter 8: Electromagnetic Nanowire Resonances for Field-Enhanced Spectroscopy," Lecture Notes in Nanoscale Science and Technology, vol. 3: One-Dimensional Nanostructures, Springer Science +Business Media, LLC, 2008, pp. 175-215.
Tiwari, S. et al., "A silicon nanocrystals based memory," Applied Physics Letters, vol. 68, No. 10, Mar. 4, 1996, American Institute of Physics, 3 pages.
Non-Final Office Action for U.S. Appl. No. 13/891,692, mailed Apr. 16, 2015, 10 pages.
Notice of Allowance for U.S. Appl. No. 14/169,906, mailed Apr. 6, 2015, 8 pages.
Notice of Allowance for U.S. Appl. No. 14/210,809, mailed Jun. 9, 2015, 7 pages.

* cited by examiner

MULTIPLE FILTER PHOTON CONVERSION ASSEMBLY

RELATED APPLICATIONS

This application is a continuation-in-part of and claims the benefit of co-pending U.S. patent application Ser. No. 13/891,692, filed May 10, 2013, entitled MULTI-SPECTRAL PHOTON CONVERTING IMAGING APPARATUS, which claims priority to Provisional Patent Application No. 61/645,514, filed May 10, 2012, entitled, PHOTON CONVERSION IMAGING USING DOPED NANOPARTICLE MATERIALS, each of which is hereby incorporated herein by reference in its entirety.

TECHNICAL FIELD

The embodiments generally relate to photon conversion, and in particular to a multiple filter photon conversion assembly that increases the efficiency of photon conversion.

BACKGROUND

Photon conversion materials do not exhibit one hundred percent efficiency, and thus some photons in received bands are not successfully converted to photons in converted bands. Moreover, photon conversion materials emit photons in converted bands in every direction, and thus some converted photons are emitted in directions other than toward a sensor that is configured to detect the converted photons. It would be desirable to increase the efficiency of the conversion of photons in received bands into photons in converted bands, and to increase the quantity of converted photons that are directed toward and detected by a sensor.

SUMMARY

The embodiments relate to increasing the efficiency of the photon conversion process. In one embodiment, a photon conversion assembly is provided that includes a first filter assembly that is configured to transmit photons in at least one received band in a downstream direction of an optical pathway, and to reflect photons in at least one converted band that are moving in an upstream direction of the optical pathway. The photon conversion assembly also includes a photon conversion material that has a first side and a second side. The first side is oriented toward the first filter assembly, and the second side is oriented toward a second filter assembly. The photon conversion material is configured to convert photons in at least one received band to photons in at least one converted band. The second filter assembly is configured to transmit photons in the at least one converted band in a downstream direction of the optical pathway, and to reflect photons in the at least one received band that are moving in the downstream direction of the optical pathway back upstream toward the photon conversion material. In this manner, unconverted photons may be passed through the photon conversion material in multiple passes, increasing the efficiency of the photon conversion process. Moreover, converted photons emitted in a direction away from an image sensor are reflected back downstream toward the image sensor, increasing the quantity of converted photons that are received by the image sensor.

In another embodiment, a photon conversion assembly is provided that includes a photon conversion material having a first side and a second side, wherein the first side is oriented in a direction to receive photons from a scene, and the second side is oriented in a direction toward an image sensor. The photon conversion material is configured to convert photons in at least one received band to photons in at least one converted band. The photon conversion assembly includes a first filter assembly. The first filter assembly includes a first filter and a first reflective layer. The first filter is configured to transmit the photons in the at least one received band, and the first reflective layer is configured to transmit the photons in the at least one received band and to reflect the photons in the at least one converted band toward the photon conversion material. Thus, converted photons that are emitted by the conversion material in a direction toward the origin of the received photons are reflected back downstream toward the photon conversion material.

The photon conversion assembly also includes a second filter assembly. The second filter assembly includes a second reflective layer that is configured to transmit the photons in the at least one converted band back downstream toward the image sensor and to reflect the photons in the at least one received band back upstream toward the photon conversion material. Thus, unconverted photons that pass through the photon conversion material without being converted are reflected by the second reflective layer back upstream toward the photon conversion material for an additional pass through the photon conversion material.

In one embodiment, the first filter is configured to transmit photons in a plurality of received bands including the at least one received band, and to block photons in any band other than the plurality of received bands. The photon conversion material is configured to convert photons in each received band of the plurality of received bands to photons in a corresponding converted band of a plurality of converted bands. The first reflective layer is configured to transmit the photons in each received band of the plurality of received bands, and to reflect the photons in each converted band of the plurality of converted bands. Thus, the photon conversion assembly may increase the efficiency of the photon conversion process in multiple bands concurrently.

In yet another embodiment, a photon conversion assembly is provided that includes a first filter assembly in an optical pathway. The first filter assembly includes a first filter that is configured to transmit photons in at least one received band, and a first reflective layer that is configured to transmit the photons in the at least one received band and to reflect the photons in the at least one converted band. The photon conversion assembly includes a photon conversion material in the optical pathway downstream with respect to the first filter assembly. The photon conversion material has a first side and a second side. The first side is oriented in a direction toward the first reflective layer, and the second side is oriented in a direction toward a second filter assembly. The photon conversion material is configured to convert photons in at least one received band to photons in at least one converted band.

The photon conversion assembly includes a second filter assembly in the optical pathway downstream with respect to the photon conversion material. The second filter assembly includes a second filter and a second reflective layer that is configured to transmit the photons in the at least one converted band downstream and to reflect the photons in the at least one received band toward the photon conversion material. The second filter is configured to transmit the photons in the at least one converted band downstream.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The embodiments relate to the conversion of photons in received bands to photons in converted bands, and the detection and imaging thereof. Among other advantages, some embodiments facilitate the use of relatively low cost, widely available image sensors to generate images based on photons in received bands that such image sensors would not be capable of detecting.

Figure 1:
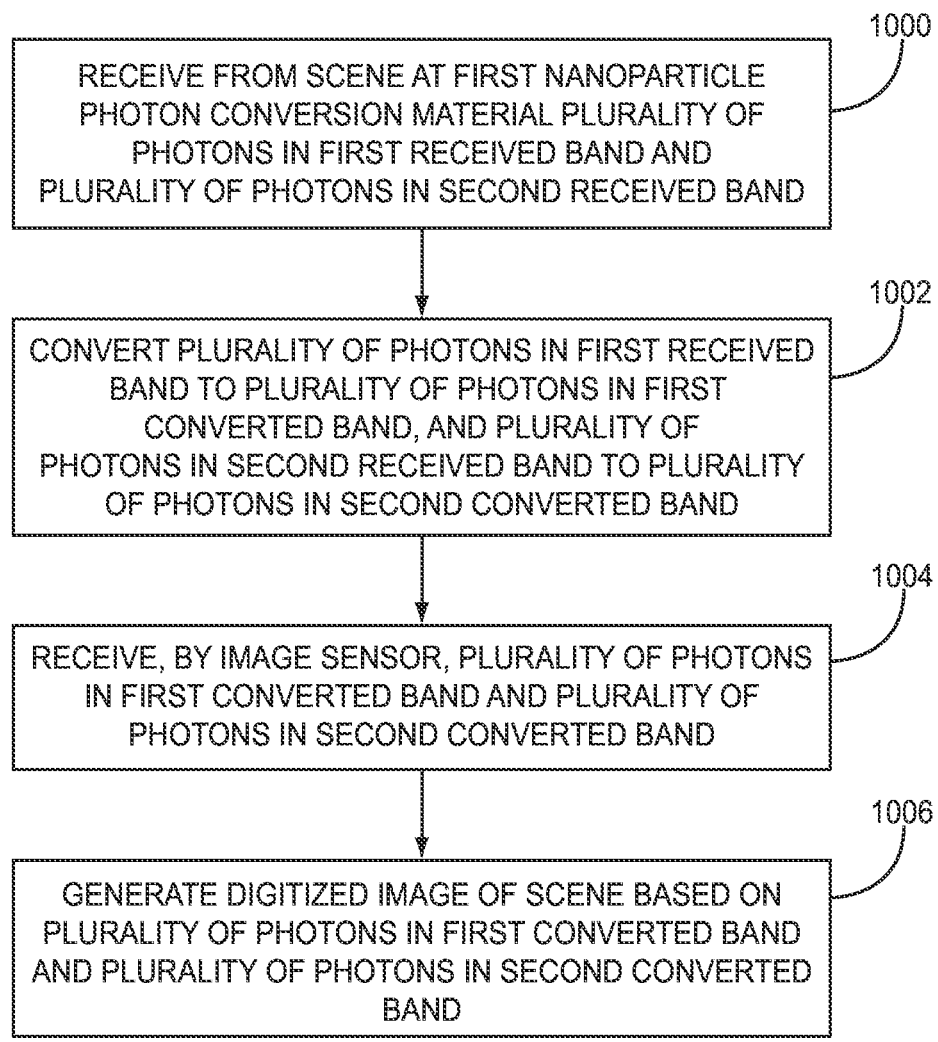
FIG. 1 is a flowchart of a process for generating an image according to one embodiment.

FIG. 1 is a flowchart of a process for generating an image according to one embodiment. A nanoparticle (NP) photon conversion material receives from a scene a plurality of photons in a first received band and a plurality of photons in a second received band (block 1000). The use herein of ordinals, such as first, second, or third, in conjunction with an element is solely for distinguishing what might otherwise be similar or identical labels, such as "first band" and "second band," and does not imply a priority, a type, an importance, or other attribute, unless otherwise stated herein. The phrase "band" refers to a range of photon wavelengths.

The NP photon conversion material converts the plurality of photons in the first received band to a plurality of photons in a first converted band, and the plurality of photons in the second received band to a plurality of photons in a second converted band (block 1002). The number of photons in the first received band may differ from the number of photons in the first converted band. An image sensor receives the plurality of photons in the first converted band and the plurality of photons in the second converted band (block 1004). The image sensor generates a digitized image of the scene based on the plurality of photons in the first converted band and the plurality of photons in the second converted band (block 1006). For purposes of illustration, many of the embodiments will be discussed in the context of received bands comprising non-visible bands, and converted bands comprising visible and/or near-infrared bands, but the embodiments are not limited to converted bands of any particular wavelengths. However, the conversion of photons to visible and/or near-infrared bands, in some embodiments, may facilitate the use of relatively low-cost image sensors used widely in digital cameras since such low-cost image sensors are typically sensitive in the visible and near-infrared bands.

Figure 2:
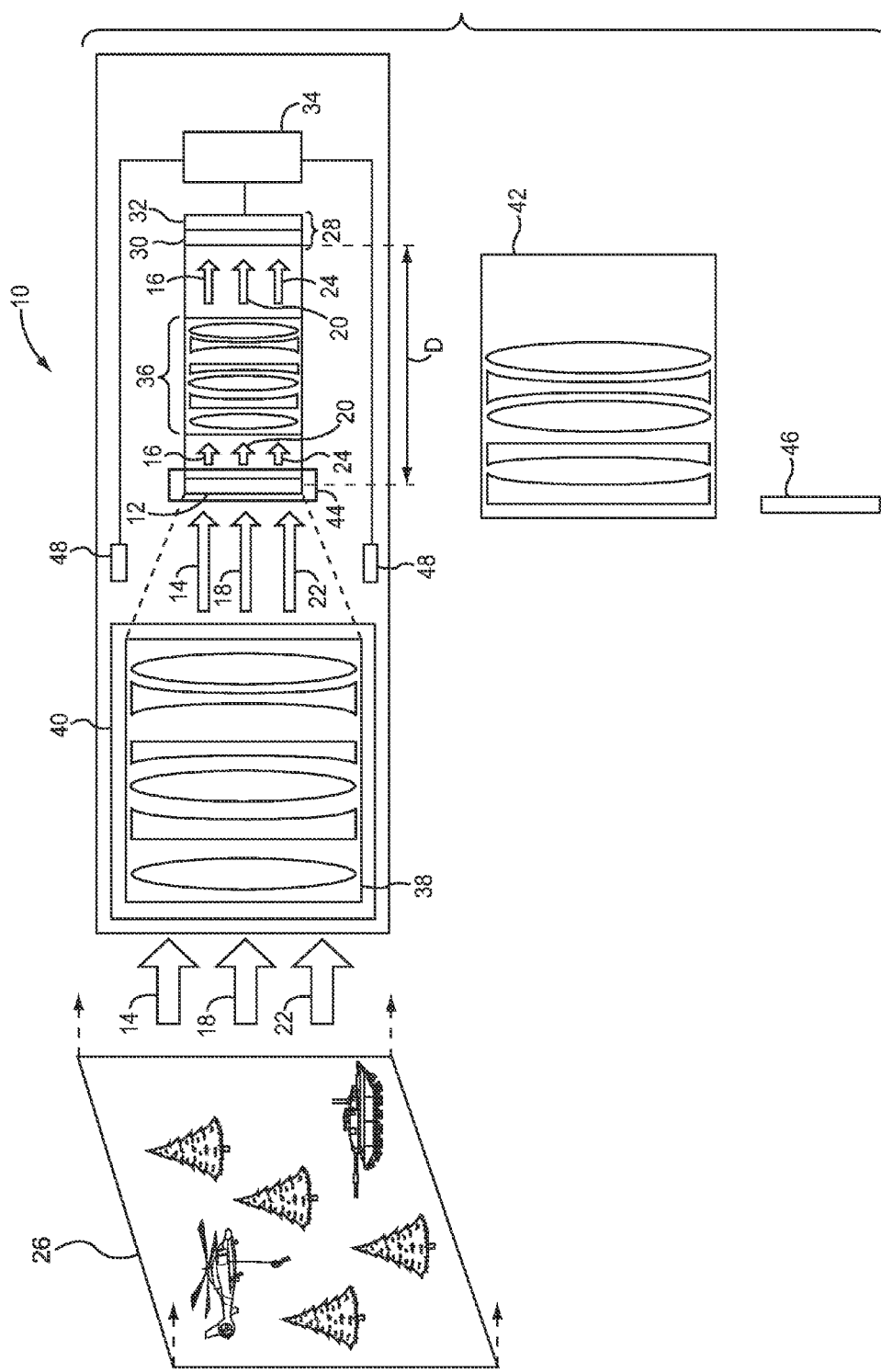
FIG. 2 is a block diagram of a multi-spectral imaging apparatus according to one embodiment.

FIG. 2 is a block diagram of a multi-spectral imaging apparatus 10 according to one embodiment. The imaging apparatus 10 includes a first NP photon conversion material 12 that is configured to convert one or more pluralities of photons in received bands to corresponding pluralities of photons in converted bands. For purposes of illustration, the embodiments will be discussed herein in the context of three received bands and three converted bands, but the embodiments are not limited to any number of received bands or converted bands. Generally, the number of bands utilized will be system dependent, and in large part may be dependent on the particular image sensor used, as discussed in greater detail herein.

In this example, the first NP photon conversion material 12 is configured to convert a plurality of photons 14 in a first received band to a plurality of photons 16 in a first converted band, a plurality of photons 18 in a second received band to a plurality of photons 20 in a second converted band, and a plurality of photons 22 in a third received band to a plurality of photons 24 in a third converted band. The plurality of photons 14 in the first received band, the plurality of photons 18 in the second received band and the plurality of photons 22 in the third received band are received from a scene 26, which may comprise, for example, all objects and matter that falls within the field of view (FOV) of the imaging apparatus 10, or the FOV of a device to which the imaging apparatus 10 is communicatively coupled.

The first NP photon conversion material 12 comprises materials, such as frequency converting nanocrystals, that are capable of "upconverting" photons of one energy level to photons of a higher energy level, such as upconverting photons in an infrared band to photons in a visible band or other converted band, or "downconverting" photons of one energy level to photons of a lower energy level, such as downconverting photons in an X-ray band to photons in a visible band or other converted band. In one embodiment, the first NP photon conversion material 12 may be coated onto a glass, or other transmissive substrate, that is transparent to photons in the converted bands, according to the particular upconverting or downconverting scheme used.

Generally such materials are engineered to absorb energy at one wavelength and emit energy at a different wavelength, thus "converting" photons of one band to photons of another band. Such materials may be synthesized, for example, using specific compositions of individual rare earth elements and other host elements. Upconversion may occur through a combination of a trivalent rare-earth sensitizer (e.g., Ytterbium (Yb), Neodymium (Nd), Erbium (Er), or Samarium (Sm)) as the element that initially absorbs the electromagnetic radiation and a second lanthanide activator ion (e.g., Erbium (Er), Holmium (Ho), Praseodymium (Pr), Thulium (Tm)) in an optical passive crystal lattice that serves as the emitting elements. Such materials are available, for example, from Sigma-Aldrich, 3050 Spruce Street, St. Louis, Mo. 63103. In some embodiments, the first NP photon conversion material 12 may comprise a mixture of elements that performs the desired conversion of received bands to converted bands, or alternatively, the first NP photon conversion material 12 may be patterned in a desired configuration, such as a striped configuration, a checkerboard configuration, or may be configured as grating planes, or as a linear variable filter.

The imaging apparatus 10 also includes an image sensor 28 that is configured to receive the plurality of photons 16 in the first converted band, the plurality of photons 20 in the second converted band, and the plurality of photons 24 in the third converted band, and based thereon, generate a digital image. The image sensor 28 comprises a photodetector array 30 and readout circuitry 32. Some of the functionality discussed herein with regard to the imaging apparatus 10 may be implemented under the control of a controller 34. The controller 34 may comprise a programmable central processing unit (CPU), application specific integrated circuit, or the like, that is configured to implement functionality discussed herein. In one embodiment, programming instructions may be stored on a memory (not illustrated), and executed by the controller 34 to implement functionality described herein.

The photodetector array 30 is multi-spectral and capable of detecting photons at different bands, and in particular capable of detecting photons at the different converted bands that are received by the photodetector array 30. In one embodiment, the photodetector array 30 includes a color-filter array capable of separating different incoming visible and/or near-infrared converted bands.

In the embodiment illustrated in FIG. 2, the first NP photon conversion material 12 may be positioned at a distance D from the image sensor 28. The distance D may position the first NP photon conversion material 12 in an image plane that is conjugant to an image plane of the photodetector array 30. While the distance D is system dependent, the distance D, in some embodiments, may range from 1 mm to 100 mm. The imaging apparatus 10 may include a lens arrangement 36 that is configured to direct the plurality of photons 16 in the first converted band, the plurality of photons 20 in the second converted band, and the plurality of photons 24 in the third converted band onto the image sensor 28.

The imaging apparatus 10 may also include a lens arrangement 38 that is configured to direct the plurality of photons 14 in the first received band, the plurality of photons 18 in the second received band and the plurality of photons 22 in the third received band onto the first NP photon conversion material 12. The lens arrangement 38 may be configured to direct photons in particular received bands, but be incapable of, or less efficient at, directing photons of other received bands. Accordingly, in one embodiment, the imaging apparatus 10 includes a lens arrangement receiver 40 that has a released mode and an engaged mode. The lens arrangement receiver 40 is configured to fix the lens arrangement 38 with respect to the first NP photon conversion material 12 when in the engaged mode. In the released mode, a user may remove the lens arrangement 38 from the lens arrangement receiver 40, and insert a different lens arrangement 42 that may be configured to direct photons in one or more different received bands onto the first NP photon conversion material 12. The lens arrangement receiver 40 may comprise any suitable interface, such as a threaded interface, friction interface, or the like.

Similarly, the first NP photon conversion material 12 may be configured to convert pluralities of photons of particular received bands into corresponding pluralities of photons of converted bands, but be ineffective at converting photons of other received bands. Accordingly, the imaging apparatus 10 may include a NP photon conversion material receiver 44 that has a released mode and an engaged mode, and that is configured to fix the NP photon conversion material 12 with respect to the image sensor 28 when in the engaged mode. If the detection of different pluralities of received bands are of interest to a user, the user may release the first NP photon conversion material 12 from the NP photon conversion material receiver 44, and insert a second NP photon conversion material 46 into the NP photon conversion material receiver 44. Thus, the imaging apparatus 10 may facilitate the conversion of any desired pluralities of photons of received bands to desired pluralities of photons of converted bands through the selection of a particular NP photon conversion material, and inserting particular NP photon conversion material into the NP photon conversion material receiver 44.

For example, the first NP photon conversion material 12 may convert a plurality of photons in the short-wave infrared band to a plurality of photons in a red visible band, and a plurality of photons in the mid-wave infrared band to a plurality of photons in a blue visible band. The second NP photon conversion material 46 may convert a plurality of photons in a particular long-wave infrared band to a plurality of photons in a red visible band, and a plurality of photons in a different long-wave infrared band to a plurality of photons in a blue visible band.

The use of different NP photon conversion materials may be done independent of, or in conjunction with, the use of a particular lens arrangement 38, 42, and insertion thereof into the lens arrangement receiver 40. For example, the lens arrangement 38 may be configured to direct photons in the short-wave and mid-wave infrared bands. The lens arrangement 42 may be configured to direct photons in the long-wave band. Different NP photon conversion materials and/or lens arrangements may be used to generate images of the same scene 26.

The imaging apparatus 10 may include one or more energy sources 48 that are configured to increase an energy level of the first NP photon conversion material 12. Increasing the energy level of the first NP photon conversion material 12 may increase photon conversion efficiency. The energy sources 48 may emit energy at a particular wavelength that when absorbed by the first NP photon conversion material 12 increases the energy level of the first NP photon conversion material 12. In one embodiment, during a down-cycle, sometimes referred to as an off-cycle, of the image sensor 28, the controller 34 may activate the energy sources 48 to emit energy at the desired wavelength(s) for a period of time during the off-cycle. The controller 34 may then, immediately prior to an up-cycle, sometimes referred to as an on-cycle, of the image sensor 28, deactivate the energy sources 48. In other embodiments, particularly wherein the energy sources 48 comprise an electromagnetic field, or an electron beam, the energy sources 48 may remain continuously on during off- and on-cycles of the image sensor 28. In some embodiments, the energy sources 48 may comprise an electromagnetic energy source, such as a laser light, or an electric energy source, such as a static field generated from a transparent capacitor plate positioned on either side of the first NP photon conversion material 12.

Figure 3:
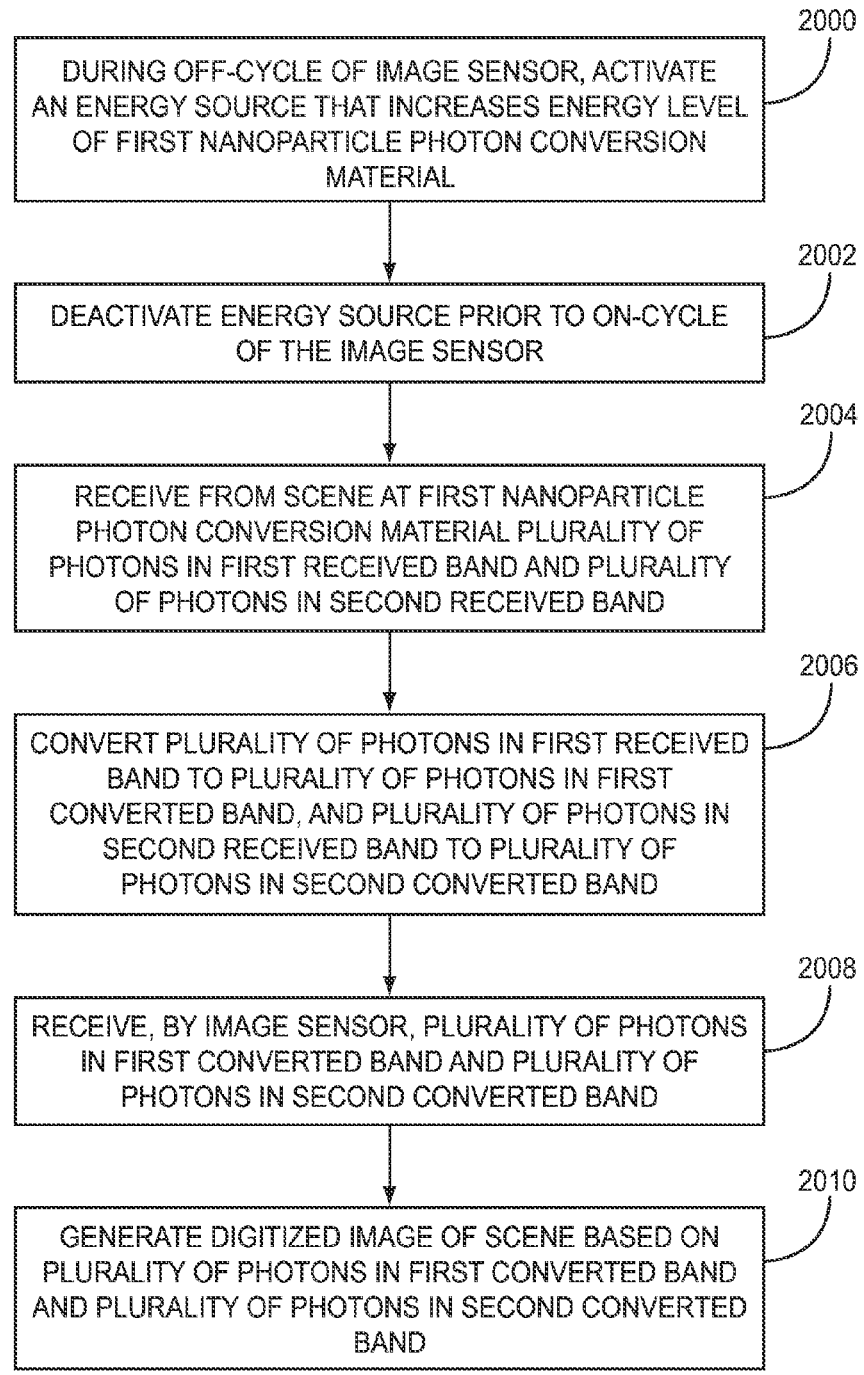
FIG. 3 is a flowchart of a method for increasing an energy level of a nanoparticle photon conversion material according to one embodiment.

FIG. 3 is a flowchart of a method for increasing an energy level of a NP photon conversion material according to one embodiment, and will be discussed in conjunction with FIG. 2. During an off-cycle of the image sensor 28, the controller 34 activates the energy sources 48 to increase the energy level of the first NP photon conversion material 12 (block 2000). Prior to the on-cycle of the image sensor 28, the controller 34 deactivates the energy sources 48 (block 2002). Processing in blocks 2004-2010 may be substantially similar or identical to blocks 1000-1006, respectively, as described above with regard to FIG. 1.

Figure 4:
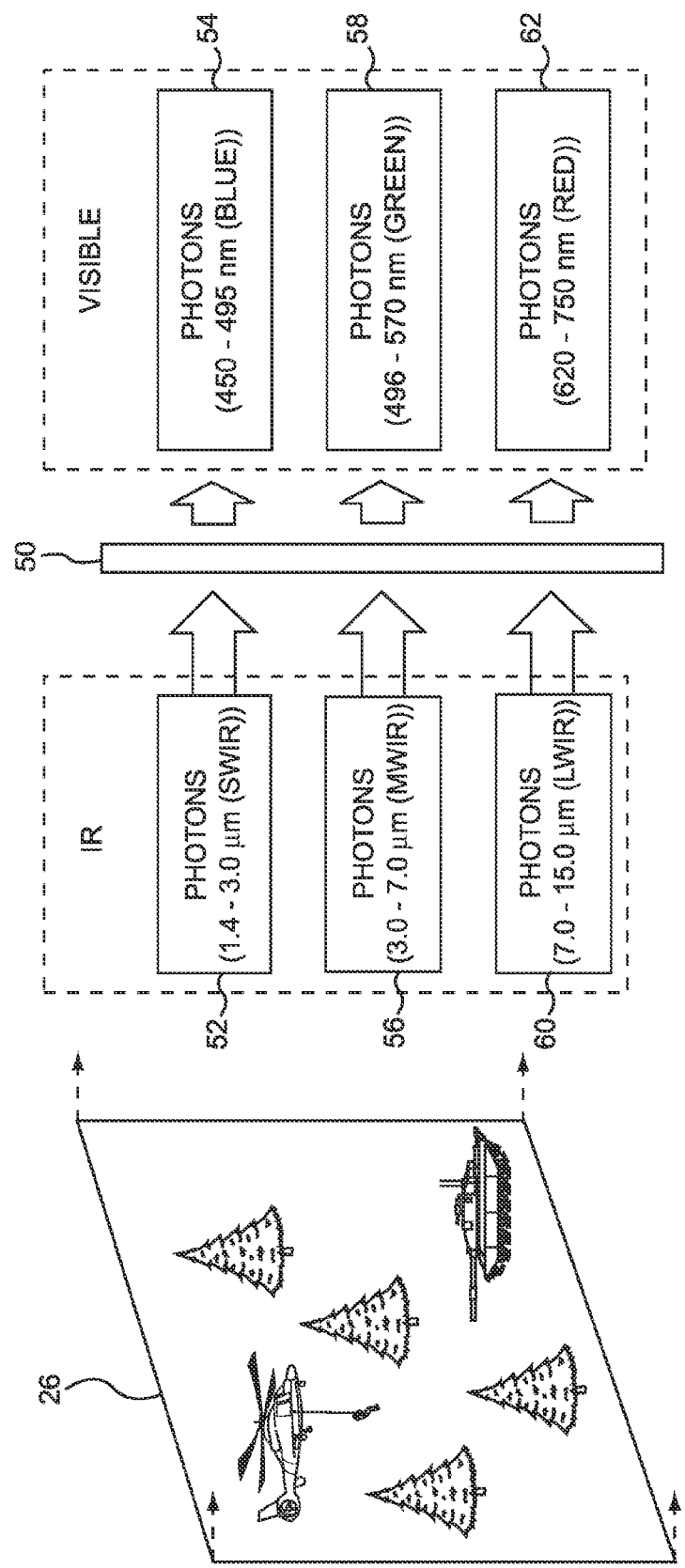
FIG. 4 is a block diagram illustrating an example conversion of pluralities of photons in received bands to corresponding pluralities of photons in converted bands according to one embodiment.

FIG. 4 is a block diagram illustrating an example conversion of pluralities of photons in received bands to corresponding pluralities of photons in converted bands according to one embodiment. In this embodiment, a NP photon conversion material 50 is configured to convert a plurality of photons 52 in a short-wave infrared band comprising wavelengths of about 1.4 μm to about 3.0 μm to a plurality of photons 54 in a blue visible band comprising wavelengths of about 450 nm to about 495 nm. The NP photon conversion material 50 is also configured to convert a plurality of photons 56 in a mid-wave infrared band comprising wavelengths of about 3.0 μm to about 7.0 μm to a plurality of photons 58 in a green visible band comprising wavelengths of about 496 nm to about 570 nm. The NP photon conversion material 50 is also configured to convert a plurality of photons 60 in a long-wave infrared band comprising wavelengths of about 7.0 μm to about 15.0 μm to a plurality of photons 62 in a red visible band comprising wavelengths of about 620 nm to about 750 nm.

Figure 5:
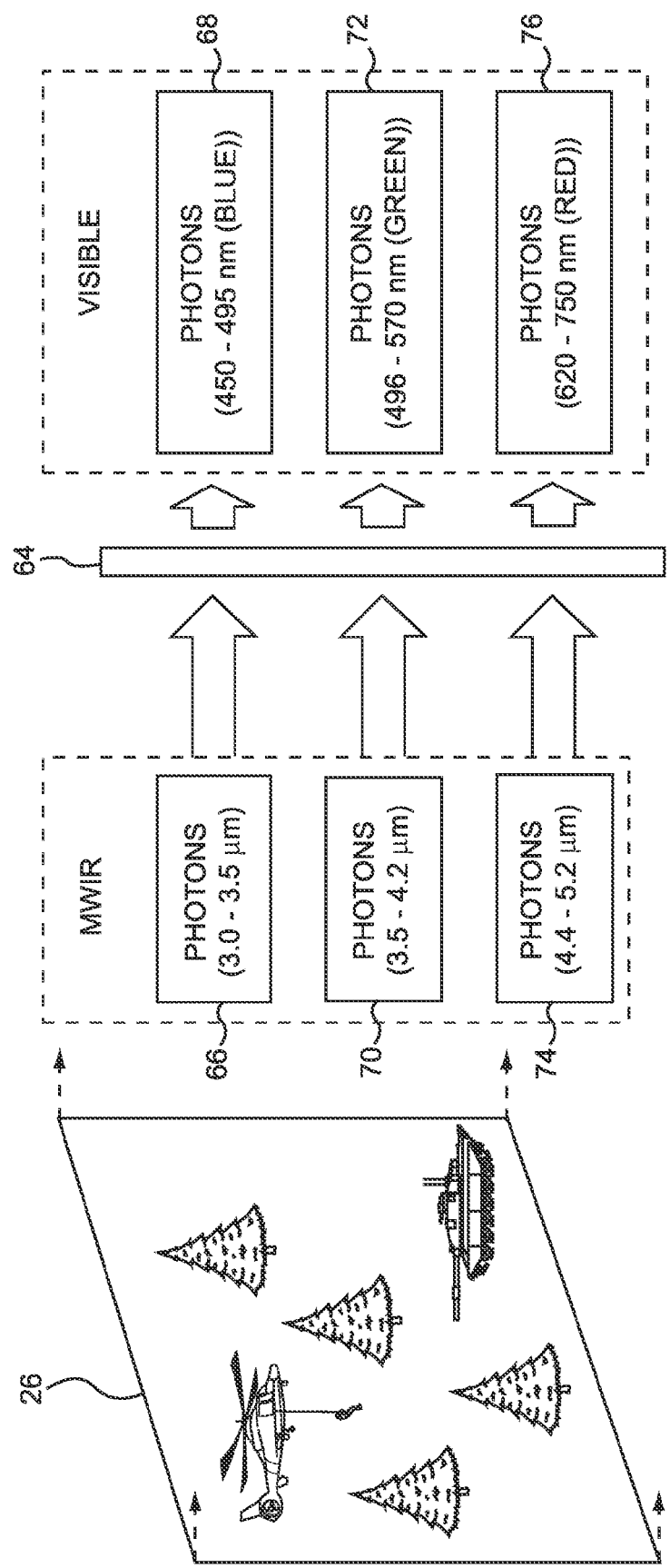
FIG. 5 is a block diagram illustrating an example conversion of pluralities of photons in received bands to corresponding pluralities of photons in converted bands according to another embodiment.

FIG. 5 is a block diagram illustrating an example conversion of pluralities of photons in received bands to corresponding pluralities of photons in converted bands according to another embodiment. In this embodiment, a NP photon conversion material 64 is configured to convert a plurality of photons 66 in a first mid-wave infrared band comprising wavelengths of about 3.0 μm to about 3.5 μm to a plurality of photons 68 in a blue visible band comprising wavelengths of about 450 nm to about 495 nm. The NP photon conversion material 64 is also configured to convert a plurality of photons 70 in a second mid-wave infrared band comprising wavelengths of about 3.5 μm to about 4.2 μm to a plurality of photons 72 in a green visible band comprising wavelengths of about 496 nm to about 570 nm. The NP photon conversion material 64 is also configured to convert a plurality of photons 74 in a third mid-wave infrared band comprising wavelengths of about 4.4 μm to about 5.2 μm to a plurality of photons 76 in a red visible band comprising wavelengths of about 620 nm to about 750 nm. Thus, as illustrated by FIGS. 4 and 5, any desired granularity of photons of received bands may be converted to a corresponding converted band for imaging by the image sensor 28.

Figure 6:
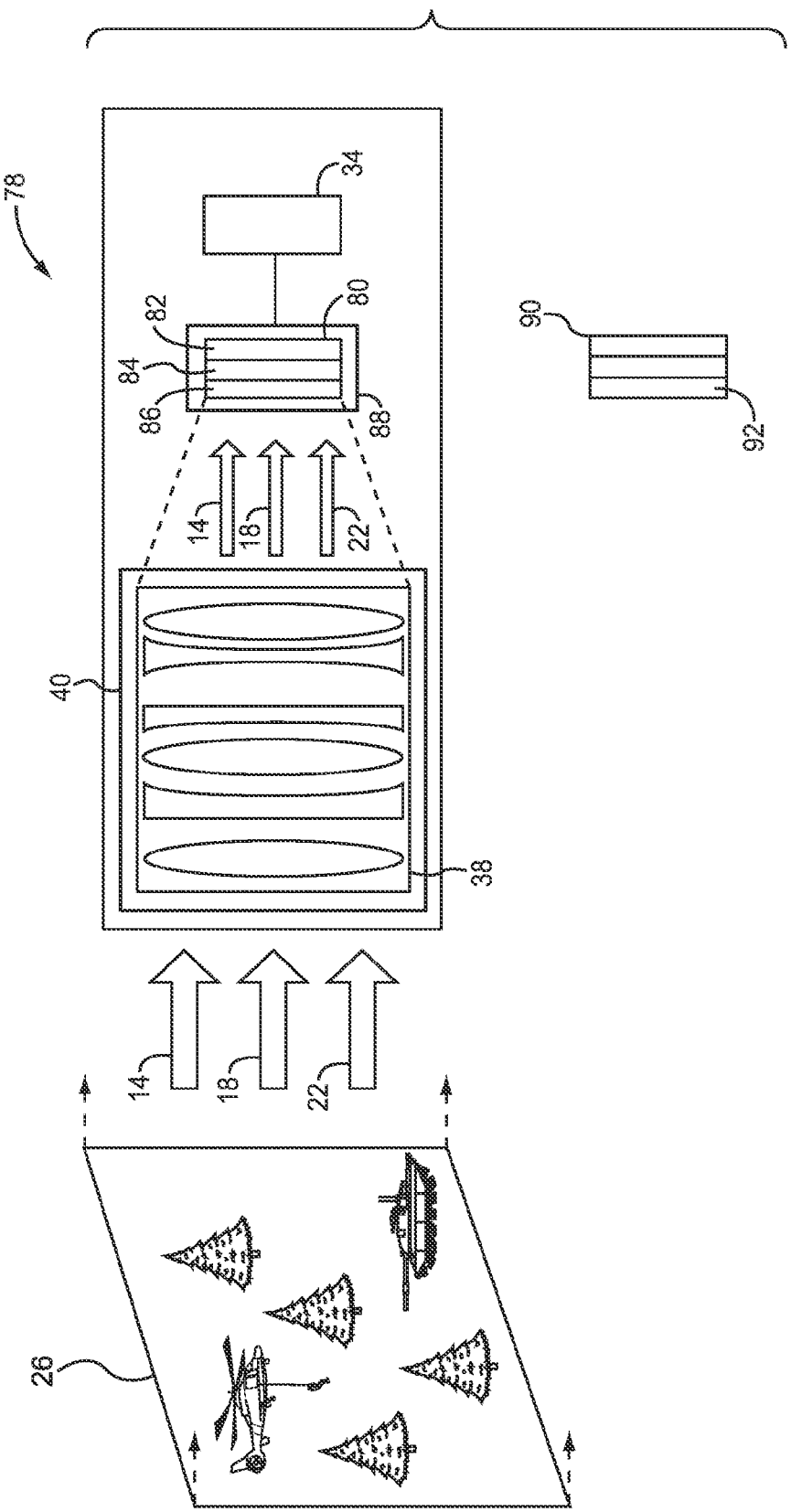
FIG. 6 illustrates a block diagram of a multi-spectral imaging apparatus according to another embodiment.

While FIGS. 5 and 6, for purposes of illustration, discuss the conversion of photons in infrared received bands, the embodiments are not so limited. The embodiments have applicability in a variety of received bands, including the X-ray and ultraviolet received bands.

FIG. 6 illustrates a block diagram of an imaging apparatus 78 according to another embodiment. In this embodiment, the imaging apparatus 78 comprises an image sensor 80 that comprises readout circuitry 82, photodetector array 84, and a NP photon conversion material 86. Thus, in this embodiment, the NP photon conversion material 86 is integrated with the photodetector array 84 and the readout circuitry 82. In this embodiment, a manufacturer of the image sensor 80 may apply the NP photon conversion material 86 onto a surface that is in proximity to the photodetector array 84, such as one or more microns from the photodetector array 84.

In this embodiment, the NP photon conversion material 86 may be configured to convert pluralities of photons 14, 18, 22 of particular received bands into corresponding pluralities of photons of converted bands, but be ineffective at converting photons of other received bands. Accordingly, the imaging apparatus 78 may include an image sensor receiver 88 that has a released mode and an engaged mode, and is configured to fix the image sensor 80 with respect to the lens arrangement 38 when in the engaged mode. In order to detect different pluralities of received bands, the user may release the image sensor 80 from the image sensor receiver 88, and insert a suitable second image sensor 90 into the image sensor receiver 88. The second image sensor 90 may include a second NP photon conversion material 92 that is configured to convert different pluralities of received bands to corresponding pluralities of photons of converted bands than that of the NP photon conversion material 86.

Figure 7:
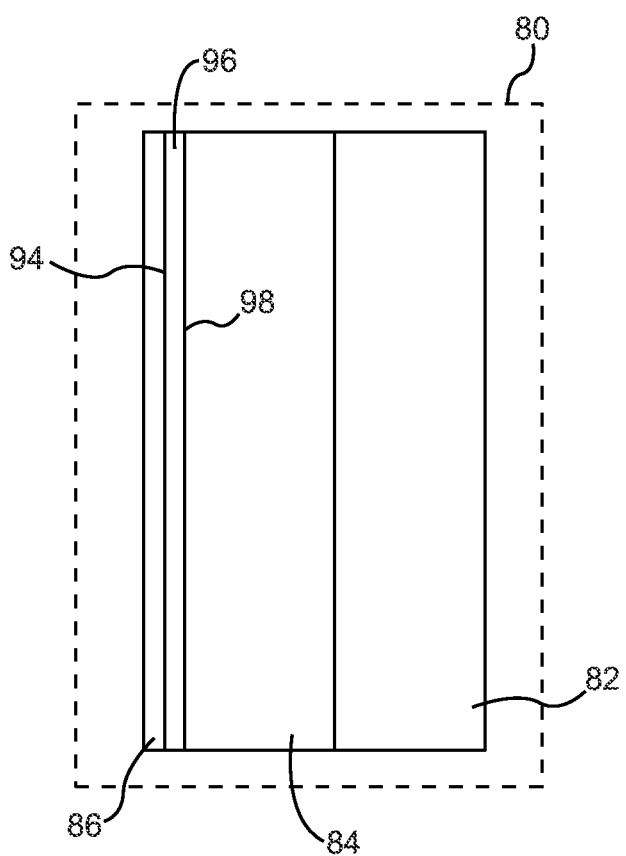
FIG. 7 is a block diagram of an image sensor illustrated in FIG. 6 according to one embodiment.

FIG. 7 is a block diagram of the image sensor 80 according to one embodiment. The NP photon conversion material 86 may be coated on a first surface 94 of a glass, or other transmissive substrate 96. The substrate 96 may comprise any suitable transmissive substrate that allows the emission of photons in converted bands toward the photodetector array 84. A second surface 98 of the substrate 96 is adjacent to the photodetector array 84. In one embodiment, the NP photon conversion material 86 coated on the first surface 94 of the transmissive substrate 96 is a distance no more than one order (<10) of the converted band of wavelengths away from the photodetector array 84.

The present embodiments, for purposes of illustration, have been described in the context of particular received bands and particular converted bands, but the embodiments are not so limited, and apply to any received bands that may be converted to any converted bands by a suitable NP photon conversion material. Other non-limiting examples of such bands include a first received band that comprises a long-wave infrared band, a second received band that comprises a first mid-wave infrared band, a first converted band that comprises a second mid-wave infrared band that is different from the first mid-wave infrared band, and a second converted band that comprises a short-wave infrared band. Additional non-limiting examples include the conversion of one or more received long-wave infrared bands to one or more corresponding converted short-wave infrared bands, the conversion of one or more received ultraviolet bands to one or more corresponding converted visible (e.g., red, blue, or green) bands, and the conversion of one or more received X-ray bands to one or more corresponding converted ultraviolet bands.

The photon conversion materials disclosed herein may not convert photons from received bands to photons in converted bands with one hundred percent efficiency. Moreover, such photon conversion materials may emit photons in converted bands in multiple directions, and thus some converted photons may be emitted in directions other than toward an image sensor, such as the image sensor 28, that is configured to detect the photons in the converted bands.

Figure 8:
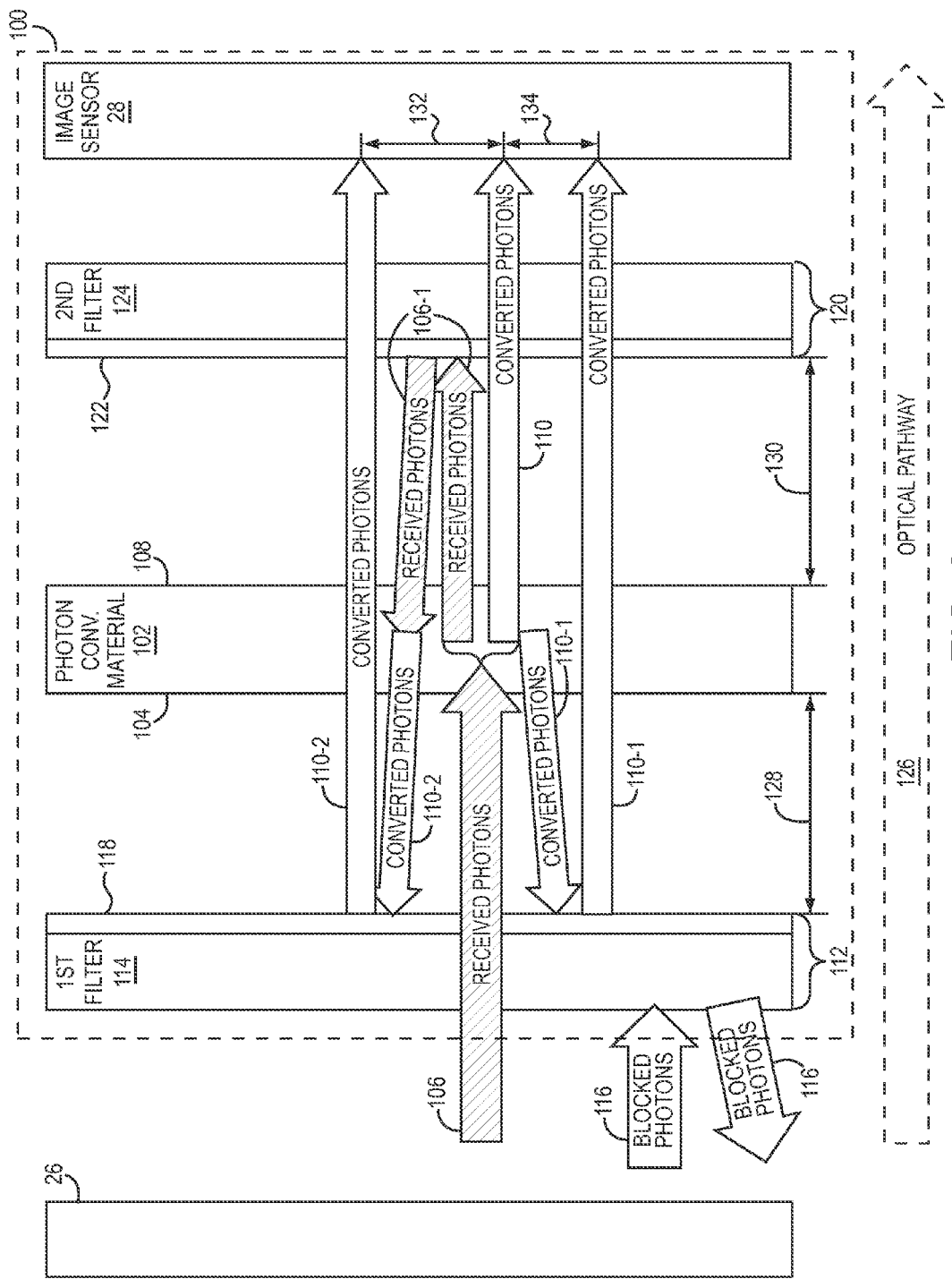
FIG. 8 is a block diagram of a photon conversion assembly according to one embodiment.

FIG. 8 is a block diagram of a photon conversion assembly 100, according to one embodiment, that increases the efficiency of photon conversion, and increases the quantity of photons reaching the image sensor 28. The photon conversion assembly 100 includes a photon conversion material 102 that is configured to convert one or more pluralities of photons in received bands to corresponding pluralities of photons in converted bands. The photon conversion material 102 may be similar or identical to the first NP photon conversion material 12 discussed above with regard to FIGS. 1-7. The photon conversion material 102 has a first side 104 that is oriented in a direction to receive photons, such as a plurality of photons 106 in a received band from a scene 26. The photon conversion material 102 has a second side 108 that is oriented in a direction toward the image sensor 28. The photon conversion material 102 is configured to convert the plurality of photons 106 in the received band to a plurality of photons 110, 110-1, 110-2 (generally, photons 110) in a converted band, as discussed above with regard to FIGS. 1-7.

A first filter assembly 112 includes a first filter 114 that is configured to transmit the plurality of photons 106 in the received band. The first filter 114 may block photons 116 in bands other than the received band. The first filter assembly 112 also includes a first reflective layer 118 that is configured to transmit the photons 106 in the received band and to reflect the photons 110 in the converted band toward the photon conversion material 102. The first filter 114 and the first reflective layer 118 may comprise separate materials that, during manufacturing, are pressed together such that the first filter 114 and the first reflective layer 118 abut one another, or, in alternative embodiments, the first reflective layer 118 may comprise a coating which is applied to a face of the first filter 114 during the manufacturing process. In some embodiments, the first filter assembly 112 may comprise a dichroic filter.

A second filter assembly 120 includes a second reflective layer 122 that is configured to transmit the photons 110 in the converted band and to reflect the photons 106 in the received band toward the photon conversion material 102. The second filter assembly 120 also includes a second filter 124 that is configured to transmit the photons 110 in the converted band toward the image sensor 28. The first and second reflective layers 118, 122 may comprise any suitable reflective material, including, for example dichroic glass designed to have the desired transmission and reflection properties at the particular bands of interest. The second filter assembly 120 may be formed similarly to that described above with regard to the first filter assembly 112. In some embodiments, the second filter assembly 120 may comprise a dichroic filter.

An optical pathway 126 indicates the path taken by the plurality of photons 106 in the received band that originate from the scene 26, which are then transmitted through the first filter assembly 112, converted by the photon conversion material 102 into the photons 110 in the converted band, transmitted by the second filter assembly 120 toward the image sensor 28, and then detected by the image sensor 28. Assume for purposes of illustration that the pluralities of photons 106 that originate from the scene 26 are directed along the optical pathway 126. For example, the photon conversion material 102 may be integrated into the multi-spectral imaging apparatus 10 illustrated in FIG. 1, and a shutter of the multi-spectral imaging apparatus 10 may be opened to allow photons that originate from the scene 26 to enter the multi-spectral imaging apparatus 10. The photons 106 in the received band are transmitted by the first filter 114 in a downstream direction of the optical pathway 126. Other photons 116 in bands other than the received band may be blocked by the first filter 114, preventing such photons 116 from reaching the photon conversion material 102.

The first reflective layer 118 also transmits the photons 106 in the received band in the downstream direction of the optical pathway 126, and toward the photon conversion material 102. The photons 106 in the received band reach the photon conversion material 102, where some photons 106 in the received band are converted to photons 110 in the converted band. The photons 110 in the converted band are emitted by the photon conversion material 102 in the downstream direction of the optical pathway 126 toward the second filter assembly 120. The photons 110 are transmitted through the second filter assembly 120 and detected by the image sensor 28.

Others of the photons 106 in the received band are converted into the photons 110-1 in the converted band. Due to the emission characteristics of the photon conversion material 102, the photons 110-1 in the converted band are emitted in an upstream direction of the optical pathway 126, and toward the first filter assembly 112. The first reflective layer 118 reflects the photons 110-1 in the converted band in a downstream direction of the optical pathway 126, through the photon conversion material 102. The photons 110-1 in the converted band are transmitted through the second filter assembly 120 and detected by the image sensor 28. Note that in the absence of the first reflective layer 118, the photons 110-1 in the converted band would not be detected by the image sensor 28.

Because the photon conversion material 102 may not have a one hundred percent conversion efficiency, some photons 106-1 in the received band pass through the photon conversion material 102 unconverted. The photons 106-1 in the received band are reflected by the second reflective layer 122 in an upstream direction of the optical pathway 126 toward the photon conversion material 102. The photons 106-1 in the received band, on their second pass through the photon conversion material 102, are converted into photons 110-2 in the converted band. The photons 110-2 in the converted band are then reflected by the first reflective layer 118 through the photon conversion material 102 in a downstream direction of the optical pathway 126. The photons 110-2 are transmitted by the second filter assembly 120 toward the image sensor 28. Note that in the absence of the second reflective layer 122, the photons 106-1 in the received band would have continued in the downstream direction of the optical pathway 126 and remain unconverted.

The photons 110-1 in the converted band may be emitted by the photon conversion material 102 in the upstream direction of the optical pathway 126. The first reflective layer 118 reflects the photons 110-1 in the converted band in a downstream direction of the optical pathway 126, through the photon conversion material 102. The photons in the converted band are transmitted through the second filter assembly 120 and detected by the image sensor 28.

Preferably a distance 128 between the first filter assembly 112 and the first side 104 of the photon conversion material 102 is relatively small, such as sub-micron distances, or, in some embodiments, the first filter assembly 112 may abut the first side 104. Similarly, a distance 130 between the second filter assembly 120 and the second side 108 of the photon conversion material 102 is relatively small, such as sub-micron distances, or, in some embodiments, the second filter assembly 120 may abut the second side 108. Increased distances 128 and 130 may be undesirable and may result in offsets 132, 134 which are manifested as blur, smear, and/or a lack of focus.

Figure 9:
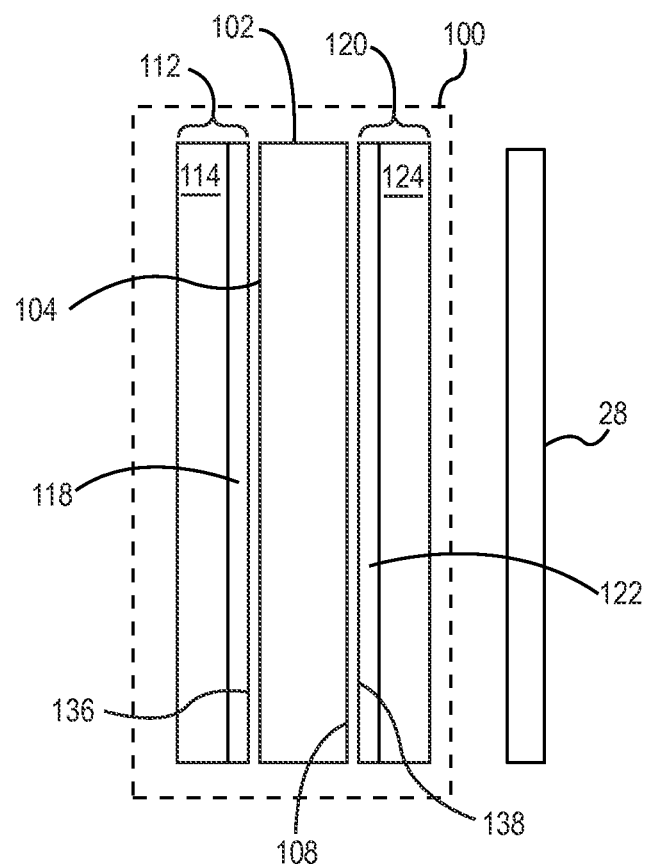
FIG. 9 is a block diagram of the photon conversion assembly according to another embodiment.

FIG. 9 is a block diagram of the photon conversion assembly 100 according to one embodiment. For purposes of illustration the first filter assembly 112, the photon conversion material 102 and the second filter assembly 120 are shown separated by a small distance from one another, but may in practice abut one another. In this embodiment, the first filter assembly 112 includes a first face 136 that may abut the first side 104 of the photon conversion material 102, and the second filter assembly 120 comprises a second face 138 that may abut the second side 108 of the photon conversion material 102. In one embodiment, the first filter assembly 112 may comprise a dichroic glass coating that is coated directly onto the first side 104 of the photon conversion material 102, and the second filter assembly 120 is a dichroic glass coating that is coated directly onto the second side 108 of the photon conversion material 102.

Figure 10:
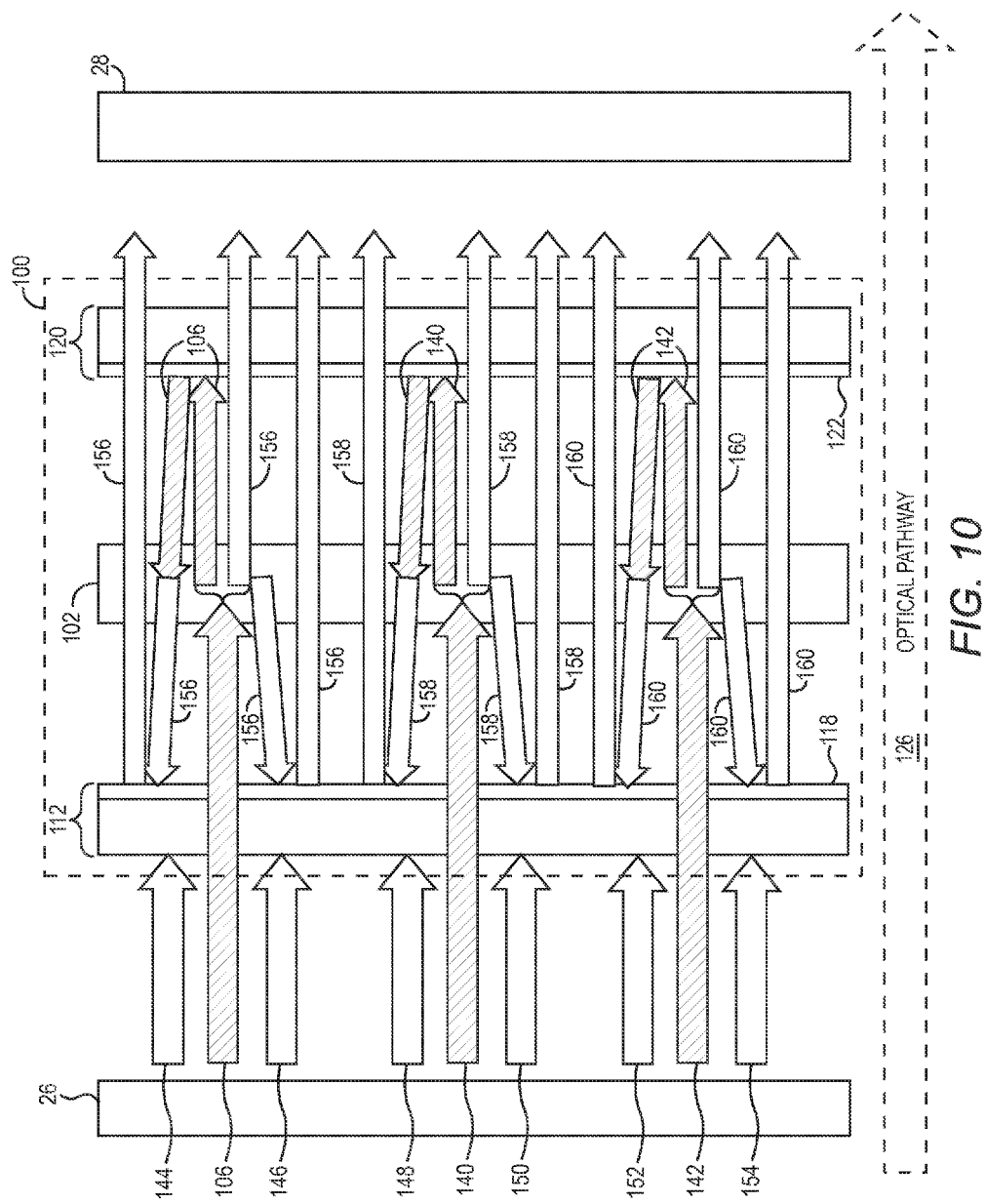
FIG. 10 is a block diagram of the photon conversion assembly according to yet another embodiment.

FIG. 10 is a block diagram of the photon conversion assembly 100 according to another embodiment. In this embodiment, the first filter assembly 112 is configured to transmit pluralities of photons 106, 140 and 142 of different received bands in the downstream direction of the optical pathway 126 toward the photon conversion material 102. The first filter assembly 112 may also be configured to block photons 144-154 in bands other than the received bands.

The photon conversion material 102 converts the photons 106 in the first received band into photons 156 in a first converted band, converts the photons 140 in the second received band into photons 158 in a second converted band, and converts the photons 142 in the third received band into photons 160 in a third converted band.

The first reflective layer 118 is configured to transmit photons 106, 140, and 142 in the received bands in the downstream direction of the optical pathway 126, and to reflect photons 156, 158 and 160 in the converted bands that are traveling in the upstream direction of the optical pathway 126 back toward the downstream direction of the optical pathway 126. The second reflective layer 122 is configured to transmit photons 156, 158 and 160 in the converted bands that are traveling in the downstream direction of the optical pathway 126 toward the image sensor 28, and to reflect photons 106, 140, and 142 in the received bands back in the upstream direction of the optical pathway 126 to direct the photons 106, 140, and 142 in the received bands toward the photon conversion material 102.

Figure 11:
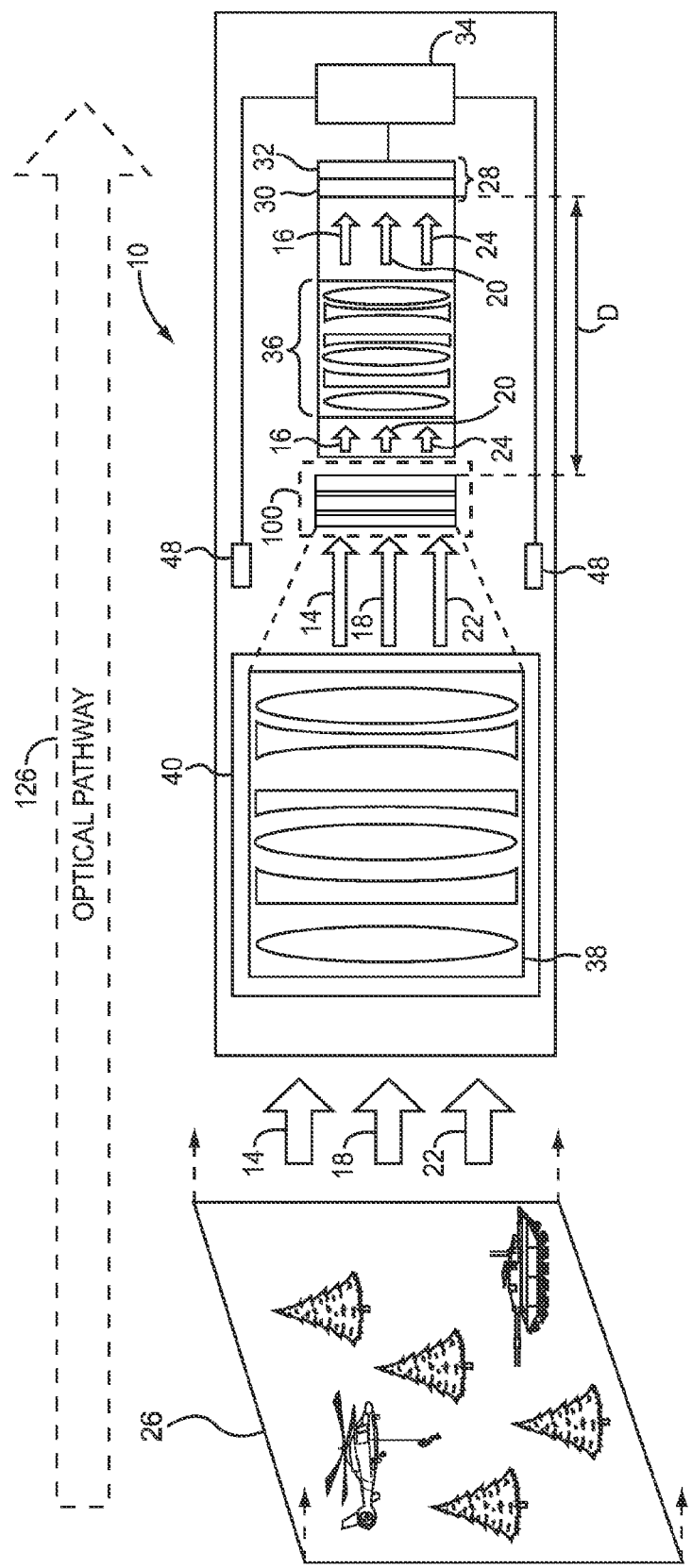
FIG. 11 is a block diagram of the photon conversion assembly in conjunction with the multi-spectral imaging apparatus discussed with regard to FIG. 1, according to one embodiment.

FIG. 11 is a block diagram of the photon conversion assembly 100 in conjunction with the multi-spectral imaging apparatus 10 discussed with regard to FIG. 1, according to one embodiment.

The present embodiments have wide applicability and may be utilized in any context in which the detection and imaging of electromagnetic radiation is desirable. One example application includes, for example, the conversion of pluralities of photons in mid-wave infrared received bands to corresponding pluralities of photons in converted bands for use in target recognition applications based on shape and spectral content. Another application includes, for example, the conversion of pluralities of photons in ultraviolet received bands in conjunction with the conversion of pluralities of photons in a mid-wave infrared received band to corresponding pluralities of photons in converted bands for use in missile warning systems. Such application may facilitate hot plume detection with significant clutter reduction. Additional applications include the conversion of pluralities of ultraviolet received bands to corresponding converted bands in fingerprint applications, factory quality imaging applications, various consumer products, and hot plume imaging. The embodiments also have applicability in realtime X-ray applications, such as medical applications, security applications, manufacturing applications, applications in the food industry, and the like. The embodiments also have wide applicability in spectroscopy applications.

Those skilled in the art will recognize improvements and modifications to the preferred embodiments of the present disclosure. All such improvements and modifications are considered within the scope of the concepts disclosed herein and the claims that follow.

What is claimed is:

1. A photon conversion assembly, comprising:
a photon conversion material having a first side and a second side, the first side oriented toward a first filter assembly, the second side oriented toward a second filter assembly, the photon conversion material configured to convert photons in at least one received band to photons in at least one converted band;
the first filter assembly, comprising:
a first filter configured to transmit the photons in the at least one received band; and
a first reflective layer configured to transmit the photons in the at least one received band and to reflect the photons in the at least one converted band toward the photon conversion material; and
the second filter assembly, comprising:
a second reflective layer configured to transmit the photons in the at least one converted band toward the image sensor and to reflect the photons in the at least one received band toward the photon conversion material; and
a second filter configured to transmit the photons in the at least one converted band toward an image sensor.

2. The photon conversion assembly of claim 1, wherein the first filter assembly comprises a first face that abuts the first side of the photon conversion material, and the second filter assembly comprises a second face that abuts the second side of the photon conversion material.

3. The photon conversion assembly of claim 1, wherein the first filter is configured to block photons in at least one blocked band.

4. The photon conversion assembly of claim 1, wherein the first filter is configured to transmit photons in a plurality of received bands including the at least one received band, and to block photons in any band other than the plurality of received bands.

5. The photon conversion assembly of claim 4, wherein the photon conversion material is configured to convert photons in each received band of the plurality of received bands to photons in a corresponding converted band of a plurality of converted bands.

6. The photon conversion assembly of claim 5, wherein the first reflective layer is configured to transmit the photons in each received band of the plurality of received bands, and to reflect the photons in each converted band of the plurality of converted bands.

7. The photon conversion assembly of claim 1, wherein the second reflective layer is configured to transmit photons in a plurality of converted bands, including the at least one converted band, and to reflect photons in a plurality of received bands, including the at least one received band.

8. The photon conversion assembly of claim 1, wherein the first filter assembly is positioned adjacent the first side of the photon conversion material, and the second filter assembly is positioned adjacent the second side of the photon conversion material.

9. A photon conversion assembly, comprising:
a first filter assembly in an optical pathway, comprising:
a first filter configured to transmit photons in at least one received band; and
a first reflective layer configured to transmit the photons in the at least one received band and to reflect the photons in the at least one converted band; and
a photon conversion material in the optical pathway downstream with respect to the first filter assembly, the photon conversion material having a first side and a second side, the first side oriented toward the first reflective layer, the second side oriented toward a second filter assembly, the photon conversion material configured to convert the photons in the at least one received band to photons in at least one converted band;

the second filter assembly in the optical pathway downstream with respect to the photon conversion material, comprising:

a second reflective layer configured to transmit the photons in the at least one converted band downstream and to reflect the photons in the at least one received band toward the photon conversion material; and a second filter configured to transmit the photons in the at least one converted band downstream.

10. The photon conversion assembly of claim 9, wherein the first filter is configured to transmit photons in a plurality of received bands including the at least one received band, and to block photons in any band other than the plurality of received bands.

11. The photon conversion assembly of claim 10, wherein the photon conversion material is configured to convert photons in each received band of the plurality of received bands to photons in a corresponding converted band of a plurality of converted bands.

12. The photon conversion assembly of claim 11, wherein the first reflective layer is configured to transmit the photons in each received band of the plurality of received bands, and to reflect the photons in each converted band of the plurality of converted bands.

13. The photon conversion assembly of claim 9, wherein the second reflective layer is configured to transmit photons in a plurality of converted bands, including the at least one converted band, and to reflect photons in a plurality of received bands, including the at least one received band.

14. A photon conversion assembly, comprising:

a first filter assembly configured to:

transmit photons in at least one received band in a downstream direction of an optical pathway and to reflect photons in at least one converted band that are moving in an upstream direction of the optical pathway;

a photon conversion material having a first side and a second side, the first side downstream of the first filter assembly, the second side upstream of a second filter assembly, the photon conversion material configured to convert the photons in the at least one received band to the photons in the at least one converted band;

the second filter assembly configured to:

transmit the photons in the at least one converted band in the downstream direction of the optical pathway and to reflect the photons in the at least one received band that are moving in the downstream direction of the optical pathway.

15. The photon conversion assembly of claim 14, wherein the first filter assembly is further configured to transmit photons in a plurality of received bands including the at least one received band in the downstream direction of the optical pathway, and to block photons in any band other than the plurality of received bands.

16. The photon conversion assembly of claim 15, wherein the photon conversion material is configured to convert photons in each received band of the plurality of received bands to photons in a corresponding converted band of a plurality of converted bands.

17. The photon conversion assembly of claim 16, wherein the first filter assembly is configured to transmit the photons in each received band of the plurality of received bands in the downstream direction of the optical pathway, and to reflect the photons in each corresponding converted band of the plurality of converted bands that are moving in the upstream direction of the optical pathway.

18. The photon conversion assembly of claim 14, wherein the second filter assembly is configured to transmit photons in a plurality of converted bands, including the at least one converted band in the downstream direction of the optical pathway, and to reflect photons in a plurality of received bands, including the at least one received band, that are moving in the downstream direction of the optical pathway.

* * * * *